United States Patent
Eda et al.

(10) Patent No.: US 12,330,392 B2
(45) Date of Patent: Jun. 17, 2025

(54) LIQUID CRYSTAL POLYMER FILM, LIQUID CRYSTAL POLYMER FILM WITH CONDUCTOR LAYER, AND MULTILAYER SUBSTRATE

(71) Applicant: Murata Manufacturing Co., Ltd., Nagaokakyo (JP)

(72) Inventors: Takeshi Eda, Nagaokakyo (JP); Fumiko Ikeda, Nagaokakyo (JP); Yutaka Mizuno, Nagaokakyo (JP); Taichi Furukawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 259 days.

(21) Appl. No.: 18/193,703

(22) Filed: Mar. 31, 2023

(65) Prior Publication Data

US 2023/0235229 A1  Jul. 27, 2023
US 2024/0076552 A9  Mar. 7, 2024

Related U.S. Application Data

(63) Continuation of application No. PCT/JP2022/023153, filed on Jun. 8, 2022.

(30) Foreign Application Priority Data

Jun. 9, 2021 (JP) ................. 2021-096549

(51) Int. Cl.
*B32B 15/20* (2006.01)
*B32B 17/10* (2006.01)
(Continued)

(52) U.S. Cl.
CPC ........ *B32B 15/20* (2013.01); *B32B 17/10504* (2013.01); *B32B 15/09* (2013.01); *B32B 27/36* (2013.01); *B32B 2305/55* (2013.01)

(58) Field of Classification Search
CPC ....... B32B 5/20; B32B 17/10504; B32B 5/09; B32B 27/36; B32B 2305/55
(Continued)

(56) References Cited

U.S. PATENT DOCUMENTS 5,494,858 A   2/1996  Gnade et al.
6,998,325 B2  2/2006  Yunogami et al.
(Continued)

FOREIGN PATENT DOCUMENTS

CN   206332152 U   7/2017
CN   112313057 A   2/2021
(Continued)

OTHER PUBLICATIONS

International Search Report in PCT/JP2022/023160, mailed Aug. 2, 2022, 3 pages.
(Continued)

*Primary Examiner* — Betelhem Shewareged
(74) *Attorney, Agent, or Firm* — ArentFox Schiff LLP

(57) ABSTRACT

A liquid crystal polymer film that includes: a benzene ring; a naphthalene ring; and a carboxymethyl group, wherein, in a $^{13}$C-NMR spectrum of a liquid crystal polymer film decomposed with supercritical methanol, an integral value CA of a peak derived from the benzene ring, an integral value CB of a peak derived from the naphthalene ring, and an integral value CC of a peak derived from the carboxymethyl group satisfy (CA+CB)/CC of 1.35 to 1.65.

16 Claims, 3 Drawing Sheets

(51) Int. Cl.
*B32B 15/09* (2006.01)
*B32B 27/36* (2006.01)

(58) Field of Classification Search
USPC .......................................................... 428/192
See application file for complete search history.

(56) References Cited

U.S. PATENT DOCUMENTS

| | | |
|---|---|---|
| 2006/0148209 A1 | 7/2006 | Maruyama et al. |
| 2009/0065240 A1* | 3/2009 | Onodera ................. B32B 27/36 428/43 |
| 2017/0077579 A1 | 3/2017 | Baba et al. |
| 2019/0363417 A1 | 11/2019 | Xu et al. |
| 2021/0268695 A1 | 9/2021 | Uchiyama et al. |
| 2023/0183466 A1 | 6/2023 | Kuwajima et al. |
| 2023/0203376 A1 | 6/2023 | Kono |
| 2023/0327309 A1 | 10/2023 | Ikemoto et al. |
| 2024/0076552 A9* | 3/2024 | Eda ............................ C08J 5/18 |

FOREIGN PATENT DOCUMENTS

| | | |
|---|---|---|
| JP | 2003-008233 A | 1/2003 |
| JP | 2008103559 A | 5/2008 |
| JP | 2018109090 A | 7/2018 |
| JP | 2022086176 A | 6/2022 |
| WO | 2015186537 A1 | 12/2015 |
| WO | 2017/110618 A1 | 6/2017 |
| WO | 2018150926 A1 | 8/2018 |
| WO | 2020218140 A1 | 10/2020 |
| WO | 2021/059586 A1 | 4/2021 |
| WO | 2022/071525 A1 | 4/2022 |
| WO | 2022/071527 A1 | 4/2022 |
| WO | 2022/113591 A1 | 6/2022 |

OTHER PUBLICATIONS

International Search Report in PCT/JP2022/023153, mailed Aug. 2, 2022, 4 pages.

* cited by examiner

FIG. 12

LIQUID CRYSTAL POLYMER FILM, LIQUID CRYSTAL POLYMER FILM WITH CONDUCTOR LAYER, AND MULTILAYER SUBSTRATE

CROSS REFERENCE TO RELATED APPLICATIONS

The present application is a continuation of International application No. PCT/JP2022/023153, filed Jun. 8, 2022, which claims priority to Japanese Patent Application No. 2021-096549, filed Jun. 9, 2021, the entire contents of each of which are incorporated herein by reference.

FIELD OF THE INVENTION

The present invention relates to a liquid crystal polymer film, a liquid crystal polymer film with a conductor layer, and a multilayer substrate.

BACKGROUND OF THE INVENTION

As a method for producing a multilayer substrate for use in various electronic devices, Patent Document 1 discloses a method for producing an electronic circuit board in which liquid crystal polymer films are laminated and thermocompression-bonded, the method including the steps of: forming a circuit pattern on one or both sides of at least one liquid crystal polymer film; subjecting one or both sides of each liquid crystal polymer film to plasma treatment in an atmosphere of 80% by volume or more oxygen at a pressure of 18 Pa or less; and laminating the liquid crystal polymer films by thermocompression-bonding with the plasma-treated sides facing each other.
Patent Document 1: Japanese Unexamined Patent Application Publication No. 2008-103559

SUMMARY OF THE INVENTION

Liquid crystal polymer films are typically formed by a stretching method exemplified by flat stretching using T-die extrusion or inflation stretching using circular die extrusion to align liquid crystal polymer molecules in the in-plane direction. Liquid crystal polymers tend to have anisotropy. Liquid crystal polymer films formed by a stretching method for alignment in the in-plane direction tend to have a high coefficient of linear expansion in the thickness direction. Thus, for example, like an electronic circuit board described in Patent Document 1, in the production of a multilayer substrate using a liquid crystal polymer film, when a via-hole extending through the liquid crystal polymer film is plated to form an interlayer connection conductor connected to a conductor layer, a stress applied from the liquid crystal polymer film may cause a crack in the interlayer connection conductor. Likewise, when a multilayer substrate is produced by a simultaneous lamination method using a liquid crystal polymer film with a conductor layer having a via-hole filled with an electrically conductive paste, a stress applied from the liquid crystal polymer film may cause a crack in an interlayer connection conductor, which is a solidified product of the electrically conductive paste. Consequently, a multilayer substrate produced by using a liquid crystal polymer film may have an interlayer connection conductor with lower connection reliability.

Thus, liquid crystal polymer films have a high coefficient of linear expansion in the thickness direction and have low processability in the production of multilayer substrates. When a liquid crystal polymer film is used as a constituent of a multilayer substrate, therefore, it is required to reduce the coefficient of linear expansion of the liquid crystal polymer film in the thickness direction.

On the other hand, there is a known method of forming a liquid crystal polymer film by using a liquid crystal polymer with a low coefficient of volume expansion.

Due to their rigid molecular skeletons, however, liquid crystal polymers with a low coefficient of volume expansion are hard and are difficult to deform. Liquid crystal polymer films formed from liquid crystal polymers with a low coefficient of volume expansion are therefore also hard and are difficult to deform and, more specifically, have a high storage elastic modulus. When such a liquid crystal polymer film with a high storage elastic modulus is used to produce a multilayer substrate by a simultaneous lamination method, the hot-pressing temperature is increased to enhance the pressure-bonding property of the liquid crystal polymer film. A high hot-pressing temperature causes the decomposition of a liquid crystal polymer during hot-pressing and tends to generate gas. The gas thus generated is often trapped in a multilayer substrate and causes a problem, such as swelling of the multilayer substrate. Furthermore, the gas thus generated can contaminate a vacuum chamber or the like of a vacuum pressing machine used to produce a multilayer substrate and is likely to cause a device failure, such as clogging of an evacuation pipe. Furthermore, a high hot-pressing temperature tends to degrade a sealing material of a vacuum pressing machine used for hot-pressing. Thus, the degree of vacuum cannot be maintained, and there is a risk of oxidation of a multilayer substrate or trapping of gas in a multilayer substrate.

The present invention has been made to solve the above problems and aims to provide a liquid crystal polymer film with a low coefficient of linear expansion in the thickness direction and with a low storage elastic modulus. The present invention also aims to provide a liquid crystal polymer film with a conductor layer including the liquid crystal polymer film. The present invention also aims to provide a multilayer substrate including the liquid crystal polymer film with the conductor layer.

A liquid crystal polymer film according to an aspect of the present invention includes: a benzene ring; a naphthalene ring; and a carboxymethyl group, wherein, in a $^{13}$C-NMR spectrum of a liquid crystal polymer film according to the present invention decomposed with supercritical methanol, an integral value CA of a peak derived from the benzene ring, an integral value CB of a peak derived from the naphthalene ring, and an integral value CC of a peak derived from the carboxymethyl group satisfy (CA+CB)/CC of 1.35 to 1.65.

A laminate structure according to an aspect of the present invention includes: a liquid crystal polymer film according to the present invention; and a conductor layer adjacent to one main surface of the liquid crystal polymer film.

A multilayer substrate according to the present invention includes the laminate structure having the liquid crystal polymer film and the conductor layer according to the present invention.

The present invention can provide a liquid crystal polymer film with a low coefficient of linear expansion in the thickness direction and with a low storage elastic modulus. The present invention can also provide a liquid crystal polymer film with a conductor layer including the liquid crystal polymer film. The present invention can also provide a multilayer substrate including the liquid crystal polymer film with the conductor layer.

DETAILED DESCRIPTION OF THE PREFERRED EMBODIMENTS

A liquid crystal polymer film according to the present invention, a liquid crystal polymer film with a conductor layer according to the present invention, and a multilayer substrate according to the present invention are described below. The present invention is not limited to the following embodiments and may be modified as appropriate without departing from the gist of the present invention. The present invention also includes a combination of preferred embodiments described below.

In a $^{13}$C-NMR spectrum of a liquid crystal polymer film according to the present invention decomposed with supercritical methanol, an integral value CA of a peak derived from a benzene ring, an integral value CB of a peak derived from a naphthalene ring, and an integral value CC of a peak derived from a carboxymethyl group satisfy (CA+CB)/CC of 1.35 to 1.65.

In the present description, a "film" is synonymous with a "sheet" and is not distinguished from a sheet due to the thickness.

Figure 1:
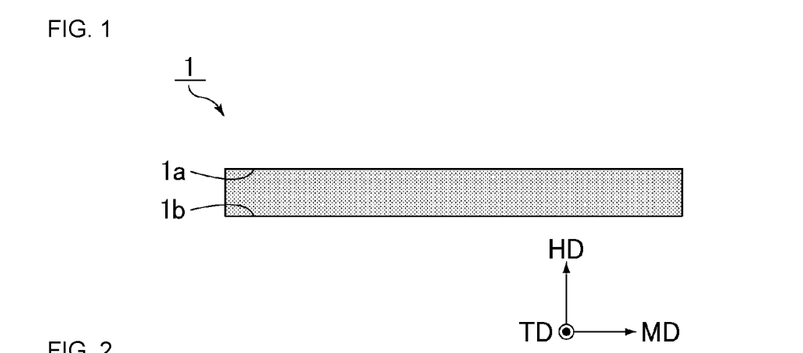
FIG. 1 is a schematic cross-sectional view of an example of a liquid crystal polymer film according to the present invention.

FIG. 1 is a schematic cross-sectional view of an example of a liquid crystal polymer film according to the present invention.

A liquid crystal polymer film 1 illustrated in FIG. 1 has a first main surface 1a and a second main surface 1b facing each other in the thickness direction HD.

The liquid crystal polymer film 1 preferably has a thickness of 10 μm to 125 μm.

In the liquid crystal polymer film 1, an in-plane direction perpendicular to the thickness direction HD includes a first direction MD and a second direction TD. In the example illustrated in FIG. 1, the first direction MD is the machine direction, and the second direction TD is the transverse direction. In the liquid crystal polymer film 1, the machine direction (first direction) MD is a direction perpendicular to the thickness direction HD and is the resin flow direction in the production of the liquid crystal polymer film 1. In the liquid crystal polymer film 1, the transverse direction (second direction) TD is a direction perpendicular to the thickness direction HD and to the machine direction (first direction) MD. Thus, in the liquid crystal polymer film 1, the thickness direction HD, the machine direction (first direction) MD, and the transverse direction (second direction) TD are perpendicular to each other.

In a $^{13}$C-NMR spectrum of the liquid crystal polymer film 1 decomposed with supercritical methanol, an integral value CA of a peak derived from a benzene ring, an integral value CB of a peak derived from a naphthalene ring, and an integral value CC of a peak derived from a carboxymethyl group satisfy (CA+CB)/CC of 1.35 to 1.65.

The liquid crystal polymer film 1 with (CA+CB)/CC of 1.65 or less can have a lower coefficient of linear expansion, for example, of 210 ppm/K or less in the thickness direction HD. Furthermore, the liquid crystal polymer film 1 with (CA+CB)/CC of 1.35 or more can have a lower storage elastic modulus, for example, of 500 MPa or less at 250° C. Thus, the liquid crystal polymer film 1 with (CA+CB)/CC of 1.35 to 1.65 can have a lower coefficient of linear expansion in the thickness direction HD and a lower storage elastic modulus.

The liquid crystal polymer film 1 has a lower coefficient of linear expansion in the thickness direction HD. When a multilayer substrate with an interlayer connection conductor is produced using the liquid crystal polymer film 1, therefore, stress is less likely to be applied from the liquid crystal polymer film 1 to the interlayer connection conductor. Thus, a multilayer substrate produced using the liquid crystal polymer film 1 is less likely to have a crack in an interlayer connection conductor, and the interlayer connection conductor is consequently less likely to have low connection reliability.

Furthermore, the liquid crystal polymer film 1 has a lower storage elastic modulus. When a multilayer substrate is produced by a simultaneous lamination method using the liquid crystal polymer film 1, it is not necessary to increase the hot-pressing temperature, so that the liquid crystal polymer is less likely to be decomposed during the hot pressing.

Liquid crystal polymers have low permittivity and hygroscopicity. Thus, a multilayer substrate produced by using the liquid crystal polymer film 1 tends to have the effects of the liquid crystal polymer, such as improved dielectric properties in a high-frequency region and smaller changes in dielectric properties due to moisture absorption.

The liquid crystal polymer film 1 with (CA+CB)/CC of less than 1.35 has a higher storage elastic modulus.

The liquid crystal polymer film 1 with (CA+CB)/CC of more than 1.65 has a higher coefficient of linear expansion in the thickness direction HD.

A liquid crystal polymer film according to the present invention preferably has (CA+CB)/CC of 1.35 to 1.60.

The liquid crystal polymer film 1 illustrated in FIG. 1 preferably has (CA+CB)/CC of 1.35 to 1.60.

(CA+CB)/CC is determined as described below.

First, a liquid crystal polymer film and methanol are put into a high-temperature and high-pressure reactor. The high-temperature and high-pressure reactor is purged with argon and is then heated to prepare a solution of the liquid crystal polymer film. For a high-temperature and high-pressure reactor of a closed system, only heating the system, for example, to 240° C. or more vaporizes methanol, pressurizes the system to the critical pressure of methanol, and brings the methanol in the system to a supercritical state. The solution is then dried under vacuum to remove the solvent and prepare a powder of a decomposition product of the liquid crystal polymer film decomposed with the supercritical methanol. The powder of the decomposition product of the liquid crystal polymer film is then dissolved in deuterated methanol, for example, at a ratio of 0.02 g per milliliter of deuterated methanol to prepare an NMR measurement sample.

The NMR measurement sample is then subjected to NMR measurement to obtain a $^{13}$C-NMR spectrum. An integral value CA of a peak derived from a benzene ring, an integral value CB of a peak derived from a naphthalene ring, and an integral value CC of a peak derived from a carboxymethyl group are then determined from the $^{13}$C-NMR spectrum.

When a liquid crystal polymer constituting a liquid crystal polymer film contains only a type II wholly aromatic polyester, a peak derived from a benzene ring, more specifically, a peak derived from methyl p-hydroxybenzoate corresponds to a peak with a chemical shift of 113 ppm to 115 ppm (114±1 ppm). A peak derived from a naphthalene ring, more specifically, a peak of methyl 6-hydroxy-2-naphthoate corresponds to a peak with a chemical shift of 107 ppm to 109 ppm (108±1 ppm). A peak derived from a carboxymethyl group, more specifically, a peak of a methyl group derived from an ester corresponds to a peak with a chemical shift of 49 ppm to 51 ppm (50±1 ppm).

(CA+CB)/CC is calculated from CA, CB, and CC thus determined.

Alternatively, as in an example described later, CA, CB, and CC may be determined as converted values based on the integral value of a peak derived from deuterated methanol, which is taken as 100, and (CA+CB)/CC may be calculated from CA, CB, and CC.

(CA+CB)/CC is controlled in the range of 1.35 to 1.65, for example, by using a plurality of wholly aromatic polyesters with different monomer primary structures as liquid crystal polymers and adjusting the blending ratio of these liquid crystal polymers in the production of a liquid crystal polymer film.

Further effects of the liquid crystal polymer film 1 are described below.

Although one known method for decreasing the coefficient of linear expansion of a liquid crystal polymer film in the thickness direction is a method of forming a film using a liquid crystal polymer with a low coefficient of volume expansion in the production of the liquid crystal polymer film, as described above, the following method may also be used.

Another known method may be a method of forming a film by using a mixed resin of a liquid crystal polymer and inorganic filler in the production of a liquid crystal polymer film.

However, inorganic filler has an active surface, and water is easily adsorbed on the surface of the inorganic filler. A multilayer substrate produced by using a liquid crystal polymer film containing inorganic filler therefore tends to have variable dielectric properties due to moisture absorption. Although the surface of inorganic filler is sometimes treated with a coupling agent or the like to reduce the activity of the surface of the inorganic filler, such surface treatment cannot sufficiently reduce the adsorption of water on the surface of the inorganic filler. Furthermore, a liquid crystal polymer film containing inorganic filler tends to have a low elongation at break.

In contrast, the liquid crystal polymer film 1 with (CA+CB)/CC of 1.65 or less can have a lower coefficient of linear expansion in the thickness direction HD. Thus, the liquid crystal polymer film 1 does not necessarily contain inorganic filler to reduce the coefficient of linear expansion in the thickness direction HD. Thus, a liquid crystal polymer film with a conductor layer including the liquid crystal polymer film 1 and a multilayer substrate including the liquid crystal polymer film with the conductor layer have smaller changes in dielectric properties due to moisture absorption. Furthermore, the elongation at break of the liquid crystal polymer film 1 is less likely to decrease.

Still another known method includes irradiating a liquid crystal polymer film with ionizing radiation to cross-link the liquid crystal polymer.

However, irradiating a liquid crystal polymer film with a high dose of ionizing radiation to decrease the coefficient of linear expansion of the liquid crystal polymer film in the thickness direction increases the production costs of the liquid crystal polymer film.

In contrast, the liquid crystal polymer film 1 with (CA+CB)/CC of 1.65 or less can have a lower coefficient of linear expansion in the thickness direction HD. In other words, the production of the liquid crystal polymer film 1 does not necessarily require a high dose of ionizing radiation to decrease the coefficient of linear expansion in the thickness direction HD. This can reduce the production costs of the liquid crystal polymer film 1.

In a $^{13}$C-NMR spectrum of an NMR measurement sample prepared by dissolving a powder of a decomposition product of a liquid crystal polymer film according to the present invention decomposed with supercritical methanol in deuterated methanol at a ratio of 0.02 g per milliliter of deuterated methanol, when the integral value of a peak derived from deuterated methanol is 100, an integral value CA of a peak derived from a benzene ring is preferably 1.05 to 1.80.

In a $^{13}$C-NMR spectrum of a NMR measurement sample prepared by dissolving a powder of a decomposition product of the liquid crystal polymer film 1 illustrated in FIG. 1 decomposed with supercritical methanol in deuterated methanol at a ratio of 0.02 g per milliliter of deuterated methanol, when the integral value of a peak derived from deuterated methanol is 100, CA is preferably 1.05 to 1.80.

In the liquid crystal polymer film 1, CA of less than 1.05 under the above conditions may result in a high storage elastic modulus.

In the liquid crystal polymer film 1, CA of more than 1.80 under the above conditions may result in a high coefficient of linear expansion in the thickness direction HD.

In a $^{13}$C-NMR spectrum of an NMR measurement sample prepared by dissolving a powder of a decomposition product of a liquid crystal polymer film according to the present invention decomposed with supercritical methanol in deuterated methanol at a ratio of 0.02 g per milliliter of deuterated methanol, when the integral value of a peak derived from deuterated methanol is 100, an integral value CB of a peak derived from a naphthalene ring is preferably 1.20 to 1.70.

In a $^{13}$C-NMR spectrum of a NMR measurement sample prepared by dissolving a powder of a decomposition product of the liquid crystal polymer film 1 illustrated in FIG. 1 decomposed with supercritical methanol in deuterated methanol at a ratio of 0.02 g per milliliter of deuterated methanol, when the integral value of a peak derived from deuterated methanol is 100, CB is preferably 1.20 to 1.70.

In the liquid crystal polymer film 1, CB of less than 1.20 under the above conditions may result in a high coefficient of linear expansion in the thickness direction HD.

In the liquid crystal polymer film 1, CB of more than 1.70 under the above conditions may result in a high storage elastic modulus.

In a $^{13}$C-NMR spectrum of an NMR measurement sample prepared by dissolving a powder of a decomposition product of a liquid crystal polymer film according to the present invention decomposed with supercritical methanol in deuterated methanol at a ratio of 0.02 g per milliliter of deuterated methanol, when the integral value of a peak derived from deuterated methanol is 100, an integral value CC of a peak derived from a carboxymethyl group is preferably 1.60 to 2.50.

In a $^{13}$C-NMR spectrum of a NMR measurement sample prepared by dissolving a powder of a decomposition product of the liquid crystal polymer film 1 illustrated in FIG. 1 decomposed with supercritical methanol in deuterated methanol at a ratio of 0.02 g per milliliter of deuterated methanol, when the integral value of a peak derived from deuterated methanol is 100, CC is preferably 1.60 to 2.50.

In the liquid crystal polymer film 1, CC of less than 1.60 under the above conditions may result in a high storage elastic modulus.

In the liquid crystal polymer film 1, CC of more than 2.50 under the above conditions may result in a high coefficient of linear expansion in the thickness direction HD.

A peak derived from deuterated methanol corresponds to a peak with a chemical shift of 47 ppm to 48 ppm (47.5±0.5 ppm).

In a liquid crystal polymer film according to the present invention, the coefficient of linear expansion in the thickness direction may be higher than the coefficient of linear expansion in a first direction perpendicular to the thickness direction and may be higher than the coefficient of linear expansion in a second direction perpendicular to the thickness direction and to the first direction.

In the liquid crystal polymer film 1 illustrated in FIG. 1, the coefficient of linear expansion in the thickness direction HD may be higher than the coefficient of linear expansion in the machine direction (first direction) MD perpendicular to the thickness direction HD and may be higher than the coefficient of linear expansion in the transverse direction (second direction) TD perpendicular to the thickness direction HD and to the machine direction (first direction) MD.

A liquid crystal polymer film according to the present invention preferably has a coefficient of linear expansion of 16.5±10 ppm/K both in the first direction and in the second direction.

The liquid crystal polymer film 1 illustrated in FIG. 1 preferably has a coefficient of linear expansion of 16.5±10 ppm/K both in the machine direction (first direction) MD and in the transverse direction (second direction) TD. In a liquid crystal polymer film with a conductor layer including the liquid crystal polymer film 1 with a conductor layer, when the conductor layer is formed of copper foil, the copper foil has a coefficient of linear expansion of approximately 16.5 ppm/K in the in-plane direction. Thus, the difference of the coefficient of linear expansion of the liquid crystal polymer film 1 in the machine direction (first direction) MD and the coefficient of linear expansion of the liquid crystal polymer film 1 in the transverse direction (second direction) TD from the coefficient of linear expansion of the copper foil in the in-plane direction is preferably within the range of ±10 ppm/K.

The liquid crystal polymer film 1 illustrated in FIG. 1 more preferably has a coefficient of linear expansion of 13 ppm/K to 20 ppm/K in the machine direction (first direction) MD.

The liquid crystal polymer film 1 illustrated in FIG. 1 more preferably has a coefficient of linear expansion of 13 ppm/K to 20 ppm/K in the transverse direction (second direction) TD.

Liquid crystal polymer films typically have a trade-off relationship between the coefficient of linear expansion in the machine direction (first direction) and the coefficient of linear expansion in the thickness direction and between the coefficient of linear expansion in the transverse direction (second direction) and the coefficient of linear expansion in the thickness direction. In other words, liquid crystal polymer films have a trade-off relationship between the coefficient of linear expansion in the in-plane direction including the machine direction (first direction) and the transverse direction (second direction) and the coefficient of linear expansion in the thickness direction. In liquid crystal polymer films, therefore, it is possible to increase the coefficient of linear expansion in the in-plane direction to reduce the coefficient of linear expansion in the thickness direction. In a liquid crystal polymer film with a conductor layer including a liquid crystal polymer film and in a multilayer substrate including the liquid crystal polymer film with the conductor layer, however, a high coefficient of linear expansion of the liquid crystal polymer film in the in-plane direction may cause a large difference between the coefficient of linear expansion of the liquid crystal polymer film in the in-plane direction and the coefficient of linear expansion of the conductor layer in the in-plane direction. This may cause warping in the liquid crystal polymer film with the conductor layer and in the multilayer substrate.

In contrast, the liquid crystal polymer film 1 with (CA+CB)/CC of 1.65 or less can have a lower coefficient of linear expansion in the thickness direction HD. Thus, in the liquid crystal polymer film 1, it is not necessary to increase the coefficient of linear expansion in the in-plane direction to reduce the coefficient of linear expansion in the thickness direction HD, and, as described above, the coefficient of linear expansion in the machine direction (first direction) MD and the coefficient of linear expansion in the transverse direction (second direction) TD can preferably be reduced to 16.5±10 ppm/K, more preferably 13 ppm/K to 20 ppm/K. Thus, the coefficient of linear expansion of the liquid crystal polymer film 1 in the in-plane direction can be closer to the coefficient of linear expansion of the conductor layer, for example, copper foil, in the in-plane direction. Thus, the liquid crystal polymer film with the conductor layer and the multilayer substrate are less likely to be warped.

The coefficient of linear expansion in the machine direction (first direction) and the coefficient of linear expansion in the transverse direction (second direction) of a liquid crystal polymer film are measured in accordance with JIS C 6481-1996. For example, a liquid crystal polymer film sample with a width of 4 mm is cooled from 170° C. to 30° C. at a cooling rate of 10° C./min under a load of 0.1 N in the machine direction (first direction) using a thermomechanical analyzer at an initial grip distance of 16 mm. During the temperature decrease, the change in grip distance is measured in the temperature range of 100° C. to 50° C. to determine the coefficient of linear expansion of the liquid crystal polymer film in the machine direction (first direction). The coefficient of linear expansion of the liquid crystal polymer film in the transverse direction (second direction) can also be determined in the same manner as the coefficient of linear expansion in the machine direction (first direction) except that the load is applied in the transverse direction (second direction).

The liquid crystal polymer film 1 is produced, for example, by a known method as described in Japanese Unexamined Patent Application Publication No. 2-3430 using a resin material containing a plurality of liquid crystal polymers as described above. The liquid crystal polymer film 1 is industrially advantageously formed by a T-die forming and stretching method, a laminate stretching method, an inflation method, or the like.

A liquid crystal polymer film with a conductor layer according to the present invention includes, in the lamination direction, a liquid crystal polymer film according to the present invention and a conductor layer adjacent to at least one main surface of the liquid crystal polymer film.

Figure 2:
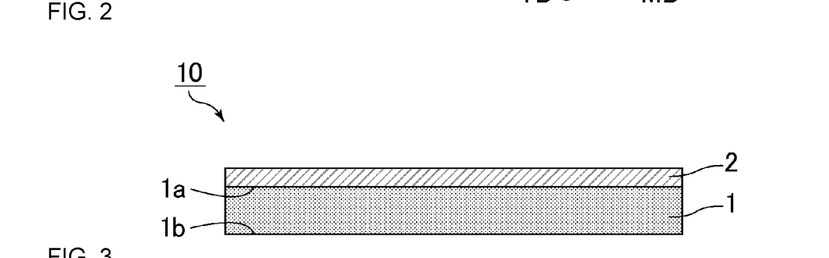
FIG. 2 is a schematic cross-sectional view of an example of a liquid crystal polymer film with a conductor layer according to the present invention.

FIG. 2 is a schematic cross-sectional view of an example of a liquid crystal polymer film with a conductor layer according to the present invention.

A liquid crystal polymer film with a conductor layer 10 illustrated in FIG. 2 includes the liquid crystal polymer film 1 and a conductor layer 2 in the lamination direction.

The lamination direction corresponds to the thickness direction of a liquid crystal polymer film constituting a liquid crystal polymer film with a conductor layer.

The conductor layer 2 is adjacent to at least one main surface of the liquid crystal polymer film 1, that is, to the first main surface 1a in the present embodiment. More specifically, the conductor layer 2 is formed on the first main surface 1a of the liquid crystal polymer film 1.

The conductor layer 2 may have a pattern shape patterned into a wire or the like or may have a planar shape spreading over the surface.

A constituent material of the conductor layer 2 is, for example, copper, silver, aluminum, stainless steel, nickel, gold, or an alloy containing at least one of these metals.

In a liquid crystal polymer film with a conductor layer according to the present invention, the conductor layer is preferably formed of copper foil.

In the liquid crystal polymer film with the conductor layer 10 illustrated in FIG. 2, the conductor layer 2 is formed of, for example, metal foil, preferably copper foil. A metal other than copper may be present on the surface of the copper foil.

In a liquid crystal polymer film with a conductor layer according to the present invention, when the conductor layer is formed of copper foil, the liquid crystal polymer film preferably has a coefficient of linear expansion of 13 ppm/K to 20 ppm/K in the first direction perpendicular to the lamination direction.

In the liquid crystal polymer film with the conductor layer 10 illustrated in FIG. 2, when the conductor layer 2 is formed of copper foil, the liquid crystal polymer film 1 preferably has a coefficient of linear expansion of 13 ppm/K to 20 ppm/K in the machine direction (first direction) MD perpendicular to the thickness direction HD (lamination direction).

In a liquid crystal polymer film with a conductor layer according to the present invention, when the conductor layer is formed of copper foil, the liquid crystal polymer film preferably has a coefficient of linear expansion of 13 ppm/K to 20 ppm/K in the second direction perpendicular to the lamination direction and to the first direction.

In the liquid crystal polymer film with the conductor layer 10 illustrated in FIG. 2, when the conductor layer 2 is formed of copper foil, the liquid crystal polymer film 1 preferably has a coefficient of linear expansion of 13 ppm/K to 20 ppm/K in the transverse direction (second direction) TD perpendicular to the thickness direction HD (lamination direction) and to the machine direction (first direction) MD.

The liquid crystal polymer film with the conductor layer 10 may further have another conductor layer adjacent to the second main surface 1b of the liquid crystal polymer film 1 in addition to the conductor layer 2.

The liquid crystal polymer film with the conductor layer 10 is produced, for example, by pressure-bonding the conductor layer 2 to the first main surface 1a of the liquid crystal polymer film 1. The conductor layer 2 pressure-bonded to the first main surface 1a of the liquid crystal polymer film 1 may be patterned by etching.

The liquid crystal polymer film with the conductor layer 10 may also be produced by pressure-bonding a patterned conductor layer 2 to the first main surface 1a of the liquid crystal polymer film 1.

A multilayer substrate according to the present invention includes a liquid crystal polymer film with a conductor layer according to the present invention.

Figure 3:
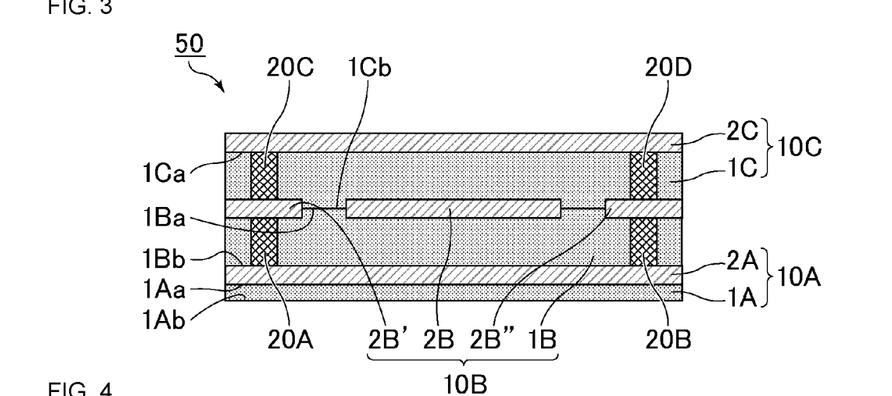
FIG. 3 is a schematic cross-sectional view of an example of a multilayer substrate according to the present invention.

FIG. 3 is a schematic cross-sectional view of an example of a multilayer substrate according to the present invention.

A multilayer substrate 50 illustrated in FIG. 3 includes a liquid crystal polymer film with a conductor layer 10A, a liquid crystal polymer film with a conductor layer 10B, and a liquid crystal polymer film with a conductor layer 10C in order in the lamination direction. Thus, in the multilayer substrate 50, the liquid crystal polymer film with the conductor layer 10A, the liquid crystal polymer film with the conductor layer 10B, and the liquid crystal polymer film with the conductor layer 10C are laminated in order in the lamination direction.

The liquid crystal polymer film with the conductor layer 10A includes a liquid crystal polymer film 1A and a conductor layer 2A.

The liquid crystal polymer film 1A has a first main surface 1Aa and a second main surface 1Ab facing each other in the thickness direction.

The conductor layer 2A is adjacent to the first main surface 1Aa of the liquid crystal polymer film 1A. The conductor layer 2A is also adjacent to a second main surface 1Bb of a liquid crystal polymer film 1B described later.

The liquid crystal polymer film with the conductor layer 10B has a liquid crystal polymer film 1B, a conductor layer 2B, a conductor layer 2B', and a conductor layer 2B".

The liquid crystal polymer film 1B has a first main surface 1Ba and a second main surface 1Bb facing each other in the thickness direction.

The conductor layers 2B, 2B', and 2B" are adjacent to the first main surface 1Ba of the liquid crystal polymer film 1B.

The conductor layers 2B, 2B', and 2B" are also adjacent to a second main surface 1Cb of a liquid crystal polymer film 1C described later.

The liquid crystal polymer film with the conductor layer 10C includes a liquid crystal polymer film 1C and a conductor layer 2C.

The liquid crystal polymer film 1C has a first main surface 1Ca and a second main surface 1Cb facing each other in the thickness direction.

The conductor layer 2C is adjacent to the first main surface 1Ca of the liquid crystal polymer film 1C.

As illustrated in FIG. 3, the conductor layer 2B is preferably located at the interface between the liquid crystal polymer film 1B and the liquid crystal polymer film 1C. This shifts the interface between the conductor layer 2B and the liquid crystal polymer film 1B and the interface between the conductor layer 2B and the liquid crystal polymer film 1C from the interface between the liquid crystal polymer film 1B and the liquid crystal polymer film 1C in the lamination direction and thereby suppresses or prevents separation at the interface between the conductor layer 2B and the liquid crystal polymer film 1B and at the interface between the conductor layer 2B and the liquid crystal polymer film 1C.

Like the conductor layer 2B, the conductor layers 2B' and 2B" are preferably located at the interface between the liquid crystal polymer film 1B and the liquid crystal polymer film 1C.

Although the interface between the liquid crystal polymer film 1B and the liquid crystal polymer film 1C is illustrated in FIG. 3, practically, the interface is not necessarily clear. When the interface between the liquid crystal polymer film 1B and the liquid crystal polymer film 1C is not clear, in a cross section in the lamination direction as illustrated in FIG. 3, a surface that passes through the center of a cross section of the conductor layer 2B in the lamination direction and extends in the in-plane direction perpendicular to the lamination direction is considered to be the interface between the liquid crystal polymer film 1B and the liquid crystal polymer film 1C.

Like the liquid crystal polymer film 1, in a $^{13}$C-NMR spectrum of the liquid crystal polymer films 1A, 1B, and 1C decomposed with supercritical methanol, an integral value CA of a peak derived from a benzene ring, an integral value CB of a peak derived from a naphthalene ring, and an integral value CC of a peak derived from a carboxymethyl group satisfy (CA+CB)/CC of 1.35 to 1.65. Thus, like the liquid crystal polymer film 1, the liquid crystal polymer films 1A, 1B, and 1C have a low coefficient of linear expansion in the thickness direction and a low storage elastic modulus.

Furthermore, the liquid crystal polymer films 1A, 1B, and 1C in the multilayer substrate 50 tend to improve the dielectric properties of the multilayer substrate 50 in a high-frequency region. Furthermore, the multilayer substrate 50 has smaller changes in dielectric properties due to moisture absorption.

Among the liquid crystal polymer films 1A, 1B, and 1C, all the liquid crystal polymer films preferably satisfy (CA+CB)/CC of 1.35 to 1.65, but some of the liquid crystal polymer films may satisfy (CA+CB)/CC of 1.35 to 1.65. In other words, the multilayer substrate 50 may have a liquid crystal polymer film not satisfying (CA+CB)/CC of 1.35 to 1.65 as long as the multilayer substrate 50 has at least one liquid crystal polymer film satisfying (CA+CB)/CC of 1.35 to 1.65.

The preferred features of the liquid crystal polymer films 1A, 1B, and 1C are the same as the preferred features of the liquid crystal polymer film 1 described above.

The thicknesses of the liquid crystal polymer films 1A, 1B, and 1C may be the same or different or may be partially different as illustrated in FIG. 3.

A constituent material of the conductor layers 2A, 2B, 2B', 2B", and 2C is, for example, copper, silver, aluminum, stainless steel, nickel, gold, or an alloy containing at least one of these metals, like a constituent material of the conductor layer 2.

Like the conductor layer 2, the conductor layers 2A, 2B, 2B', 2B", and 2C are formed of, for example, metal foil, preferably copper foil. A metal other than copper may be present on the surface of the copper foil.

The constituent materials of the conductor layers 2A, 2B, 2B', 2B", and 2C are preferably the same, may be different, or may be partially different.

The thicknesses of the conductor layers 2A, 2B, 2B', 2B", and 2C may be the same as illustrated in FIG. 3, may be different, or may be partially different.

The multilayer substrate 50 has three liquid crystal polymer films with a conductor layer in the lamination direction but may have one, two, or four or more liquid crystal polymer films with a conductor layer.

A multilayer substrate according to the present invention preferably further includes an interlayer connection conductor that extends through a liquid crystal polymer film in the lamination direction and that is connected to a conductor layer without extending through the conductor layer in the lamination direction.

The multilayer substrate 50 illustrated in FIG. 3 further includes interlayer connection conductors 20A, 20B, 20C, and 20D.

The interlayer connection conductor 20A extends through the liquid crystal polymer film 1B in the lamination direction and is connected to the conductor layer 2B' without extending through the conductor layer 2B' in the lamination direction. More specifically, the interlayer connection conductor 20A extends through the liquid crystal polymer film 1B in the lamination direction and is connected to the conductor layer 2B' on the first main surface 1Ba of the liquid crystal polymer film 1B. The interlayer connection conductor 20A is connected to the conductor layer 2A on the second main surface 1Bb of the liquid crystal polymer film 1B. Thus, the conductor layer 2A is electrically connected to the conductor layer 2B' through the interlayer connection conductor 20A.

At a position distant from the interlayer connection conductor 20A, the interlayer connection conductor 20B extends through the liquid crystal polymer film 1B in the lamination direction and is connected to the conductor layer 2B" without extending through the conductor layer 2B" in the lamination direction. More specifically, the interlayer connection conductor 20B extends through the liquid crystal polymer film 1B in the lamination direction at a position distant from the interlayer connection conductor 20A and is connected to the conductor layer 2B" on the first main surface 1Ba of the liquid crystal polymer film 1B. The interlayer connection conductor 20B is connected to the conductor layer 2A on the second main surface 1Bb of the liquid crystal polymer film 1B at a position distant from the interlayer connection conductor 20A. Thus, the conductor layer 2A is electrically connected to the conductor layer 2B" through the interlayer connection conductor 20B.

The interlayer connection conductor 20C extends through the liquid crystal polymer film 1C in the lamination direction and is connected to the conductor layer 2C without extending through the conductor layer 2C in the lamination direction. More specifically, the interlayer connection conductor 20C extends through the liquid crystal polymer film 1C in the lamination direction and is connected to the conductor layer 2C on the first main surface 1Ca of the liquid crystal polymer film 1C. The interlayer connection conductor 20C is connected to the conductor layer 2B' on the second main surface 1Cb of the liquid crystal polymer film 1C. Thus, the conductor layer 2B' is electrically connected to the conductor layer 2C through the interlayer connection conductor 20C.

At a position distant from the interlayer connection conductor 20C, the interlayer connection conductor 20D extends through the liquid crystal polymer film 1C in the lamination direction and is connected to the conductor layer 2C without extending through the conductor layer 2C in the lamination direction. More specifically, at a position distant from the interlayer connection conductor 20C, the interlayer connection conductor 20D extends through the liquid crystal polymer film 1C in the lamination direction and is connected to the conductor layer 2C on the first main surface 1Ca of the liquid crystal polymer film 1C. The interlayer connection conductor 20D is connected to the conductor layer 2B" on the second main surface 1Cb of the liquid crystal polymer film 1C at a position distant from the interlayer connection conductor 20C. Thus, the conductor layer 2B" is electrically connected to the conductor layer 2C through the interlayer connection conductor 20D.

Thus, in the multilayer substrate 50, the conductor layer 2A is electrically connected to the conductor layer 2C through the interlayer connection conductor 20A, the conductor layer 2B', and the interlayer connection conductor 20C. In the multilayer substrate 50, the conductor layer 2A is electrically connected to the conductor layer 2C also through the interlayer connection conductor 20B, the conductor layer 2B", and the interlayer connection conductor 20D.

The interlayer connection conductor 20A is formed, for example, by plating the inner wall of a via-hole, which extends through the liquid crystal polymer film 1B in the thickness direction and reaches the conductor layer 2B' without extending through the conductor layer 2B' in the thickness direction, or by filling the via-hole with an electrically conductive paste and then performing heat treatment.

The interlayer connection conductors 20B, 20C, and 20D are also formed in the same manner as the interlayer connection conductor 20A except that they are formed at different positions.

When the interlayer connection conductors 20A, 20B, 20C, and 20D are formed by plating, a metal constituting each interlayer connection conductor is, for example, copper, tin, or silver, preferably copper.

When the interlayer connection conductors 20A, 20B, 20C, and 20D are formed by heat treatment of an electrically conductive paste, a metal contained in each interlayer connection conductor is, for example, copper, tin, or silver. Among these, each interlayer connection conductor preferably contains copper, more preferably copper and tin. For example, when the interlayer connection conductor 20A contains copper and tin, and the conductor layer 2B' is formed of copper foil, the interlayer connection conductor 20A causes an alloying reaction with the conductor layer 2B' at low temperatures. Thus, the interlayer connection conductor 20A is easily electrically connected to the conductor layer 2B'. The same applies to other combinations of the interlayer connection conductor and the conductor layer.

When the interlayer connection conductors 20A, 20B, 20C, and 20D are formed by heat treatment of an electrically conductive paste, a resin contained in each interlayer connection conductor preferably contains at least one thermosetting resin selected from the group consisting of epoxy resins, phenolic resins, polyimide resins, silicon resins and modified resins thereof, and acrylic resins, or at least one thermoplastic resin selected from the group consisting of polyamide resins, polystyrene resins, polymethacrylate resins, polycarbonate resins, and cellulose resins.

The multilayer substrate 50 is used as an electronic circuit board, for example.

The multilayer substrate 50 (electronic circuit board) may include the conductor layer 2B as a signal line for transmitting a signal. In such a case, the multilayer substrate 50 constitutes a transmission line.

The multilayer substrate 50 may have the conductor layer 2B as a signal line for transmitting a signal and may also have the conductor layer 2A and the conductor layer 2C as ground electrodes. In such a case, the multilayer substrate 50 constitutes a strip-line transmission line.

When the multilayer substrate 50 constitutes the transmission line described above, the conductor layer 2B may be a signal line for transmitting a high-frequency signal.

When the multilayer substrate 50 constitutes a transmission line, the liquid crystal polymer films 1B and 1C with low permittivity in contact with the conductor layer 2B, that is, a signal line tend to improve the transmission characteristics of the multilayer substrate 50.

The multilayer substrate 50 is produced by the following method, for example.

<Step of Producing Liquid Crystal Polymer Film with Conductor Layer>

Figure 4:
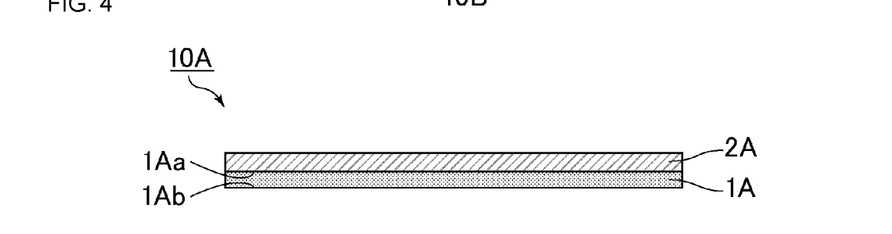
FIG. 4 is a schematic cross-sectional view of the step of producing a liquid crystal polymer film with a conductor layer in an example of a method for producing a multilayer substrate according to the present invention.
Figure 5:
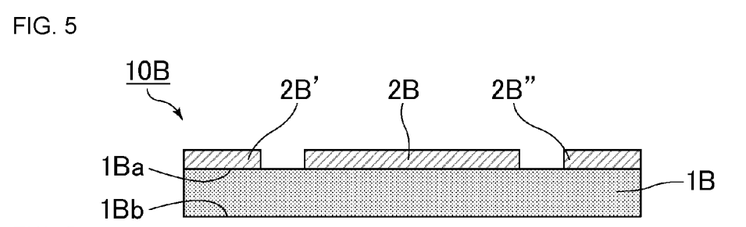
FIG. 5 is a schematic cross-sectional view of the step of producing a liquid crystal polymer film with a conductor layer in an example of a method for producing a multilayer substrate according to the present invention.
Figure 6:
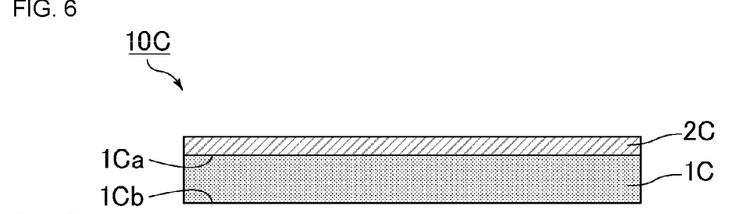
FIG. 6 is a schematic cross-sectional view of the step of producing a liquid crystal polymer film with a conductor layer in an example of a method for producing a multilayer substrate according to the present invention.

FIGS. 4, 5, and 6 are schematic cross-sectional views of the step of producing a liquid crystal polymer film with a conductor layer in an example of a method for producing a multilayer substrate according to the present invention.

As illustrated in FIG. 4, the liquid crystal polymer film with the conductor layer 10A including the conductor layer 2A adjacent to the first main surface 1Aa of the liquid crystal polymer film 1A is prepared. At this time, for example, the conductor layer 2A is pressure-bonded to the first main surface 1Aa of the liquid crystal polymer film 1A.

As illustrated in FIG. 5, the liquid crystal polymer film with the conductor layer 10B including the conductor layers 2B, 2B', and 2B" adjacent to the first main surface 1Ba of the liquid crystal polymer film 1B is prepared. At this time, for example, the conductor layer is pressure-bonded to the first main surface 1Ba of the liquid crystal polymer film 1B and is then patterned by etching into the conductor layers 2B, 2B', and 2B". Alternatively, the conductor layers 2B, 2B', and 2B" are prepared in advance and are pressure-bonded to the first main surface 1Ba of the liquid crystal polymer film 1B.

As illustrated in FIG. 6, the liquid crystal polymer film with the conductor layer 10C including the conductor layer 2C adjacent to the first main surface 1Ca of the liquid crystal polymer film 1C is prepared. At this time, for example, the conductor layer 2C is pressure-bonded to the first main surface 1Ca of the liquid crystal polymer film 1C.

<Step of Forming Via-Hole>

Figure 7:
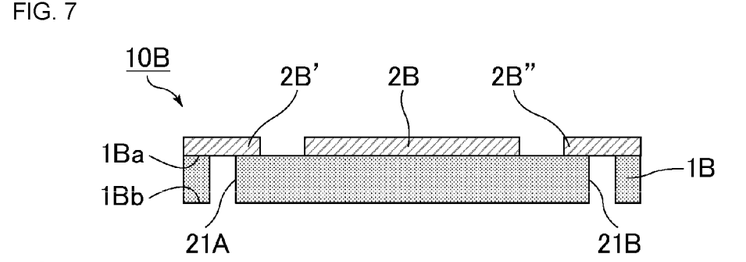
FIG. 7 is a schematic cross-sectional view of the step of forming a via-hole in an example of a method for producing a multilayer substrate according to the present invention.
Figure 8:
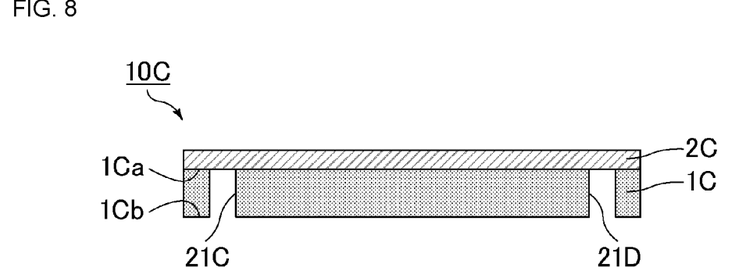
FIG. 8 is a schematic cross-sectional view of the step of forming a via-hole in an example of a method for producing a multilayer substrate according to the present invention.

FIGS. 7 and 8 are schematic cross-sectional views of the step of forming a via-hole in an example of a method for producing a multilayer substrate according to the present invention.

As illustrated in FIG. 7, a via-hole 21A is formed in the liquid crystal polymer film with the conductor layer 10B so as to extend through the liquid crystal polymer film 1B in the thickness direction and reach the conductor layer 2B' without extending through the conductor layer 2B' in the thickness direction. Thus, the conductor layer 2B' is partially exposed through the via-hole 21A.

A via-hole 21B is formed in the liquid crystal polymer film with the conductor layer 10B at a position distant from the position at which the via-hole 21A is to be formed. The via-hole 21B extends through the liquid crystal polymer film 1B in the thickness direction and reaches the conductor layer 2B" without extending through the conductor layer 2B" in the thickness direction. Thus, the conductor layer 2B" is partially exposed through the via-hole 21B.

Thus, the via-holes 21A and 21B are formed in the liquid crystal polymer film with the conductor layer 10B. The via-holes 21A and 21B may be formed at the same time point or at different time points.

As illustrated in FIG. 8, a via-hole 21C is formed in the liquid crystal polymer film with the conductor layer 10C so as to extend through the liquid crystal polymer film 1C in the thickness direction and reach the conductor layer 2C without extending through the conductor layer 2C in the thickness direction. Thus, the conductor layer 2C is partially exposed through the via-hole 21C.

At a position distant from the position at which the via-hole 21C is to be formed, a via-hole 21D is formed in the liquid crystal polymer film with the conductor layer 10C so as to extend through the liquid crystal polymer film 1C in the thickness direction and reach the conductor layer 2C without extending through the conductor layer 2C in the thickness direction. Thus, the conductor layer 2C is partially exposed through the via-hole 21D.

Thus, the via-holes 21C and 21D are formed in the liquid crystal polymer film with the conductor layer 10C. The via-holes 21C and 21D may be formed at the same time point or at different time points.

When the via-holes 21A, 21B, 21C, and 21D are formed, a liquid crystal polymer film with a conductor layer is preferably irradiated with a laser beam from the liquid crystal polymer film side.

<Step of Applying Electrically Conductive Paste>

Figure 9:
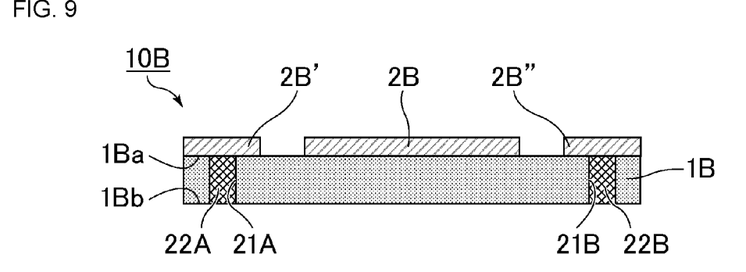
FIG. 9 is a schematic cross-sectional view of the step of applying an electrically conductive paste in an example of a method for producing a multilayer substrate according to the present invention.
Figure 10:
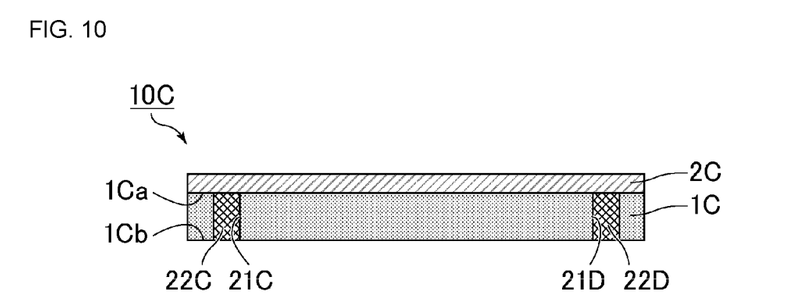
FIG. 10 is a schematic cross-sectional view of the step of applying an electrically conductive paste in an example of a method for producing a multilayer substrate according to the present invention.

FIGS. 9 and 10 are schematic cross-sectional views of the step of applying an electrically conductive paste in an example of a method for producing a multilayer substrate according to the present invention.

As illustrated in FIG. 9, the via-hole 21A in the liquid crystal polymer film with the conductor layer 10B is filled with an electrically conductive paste 22A. The via-hole 21B in the liquid crystal polymer film with the conductor layer 10B is filled with an electrically conductive paste 22B. The electrically conductive pastes 22A and 22B may be applied at the same time point or at different time points.

As illustrated in FIG. 10, the via-hole 21C in the liquid crystal polymer film with the conductor layer 10C is filled with an electrically conductive paste 22C. The via-hole 21D in the liquid crystal polymer film with the conductor layer 10C is filled with an electrically conductive paste 22D. The electrically conductive pastes 22C and 22D may be applied at the same time point or at different time points.

The electrically conductive pastes 22A, 22B, 22C, and 22D are applied, for example, by a screen printing method or a vacuum filling method.

Each of the electrically conductive pastes 22A, 22B, 22C, and 22D contains a metal and a resin, for example.

Examples of the metal contained in each of the electrically conductive pastes 22A, 22B, 22C, and 22D include copper, tin, and silver. Among these, each electrically conductive paste preferably contains copper, more preferably copper and tin.

The resin contained in each of the electrically conductive pastes 22A, 22B, 22C, and 22D preferably includes at least one thermosetting resin selected from the group consisting of epoxy resins, phenolic resins, polyimide resins, silicon resins and modified resins thereof, and acrylic resins, or at least one thermoplastic resin selected from the group consisting of polyamide resins, polystyrene resins, polymethacrylate resins, polycarbonate resins, and cellulose resins.

Each of the electrically conductive pastes 22A, 22B, 22C, and 22D may further contain a vehicle, a solvent, a thixotropic agent, an activator, and the like.

The vehicle is, for example, a rosin resin composed of rosin or a derivative of rosin, such as a modified rosin, a synthetic resin composed of rosin or a derivative of rosin, such as a modified rosin, or a mixture of these resins.

Examples of the rosin resin composed of rosin or a derivative of rosin, such as a modified rosin, include gum rosin, tall oil rosin, wood rosin, polymerized rosin, hydrogenated rosin, formylated rosin, rosin esters, rosin-modified maleic acid resins, rosin-modified phenolic resins, rosin-modified alkyd resins, and various rosin derivatives.

Examples of the synthetic resin composed of rosin or a derivative of rosin, such as a modified rosin, include polyester resins, polyamide resins, phenoxy resins, and terpene resins.

Examples of the solvent include alcohols, ketones, esters, ethers, aromatics, and hydrocarbons. Specific examples of these include benzyl alcohol, ethanol, isopropyl alcohol, butanol, diethylene glycol, ethylene glycol, glycerin, ethyl cellosolve, butyl cellosolve, ethyl acetate, butyl acetate, butyl benzoate, diethyl adipate, dodecane, tetradecene, α-terpineol, terpineol, 2-methyl-2,4-pentanediol, 2-ethylhexanediol, toluene, xylene, propylene glycol monophenyl ether, diethylene glycol monohexyl ether, ethylene glycol monobutyl ether, diethylene glycol monobutyl ether, diethylene glycol monoethyl ether, diisobutyl adipate, hexylene glycol, cyclohexane dimethanol, 2-terpinyloxyethanol, 2-dihydroterpinyloxyethanol, and mixtures thereof. Among these, terpineol, ethylene glycol monobutyl ether, diethylene glycol monobutyl ether, and diethylene glycol monoethyl ether are preferred.

Examples of the thixotropic agent include hydrogenated castor oil, carnauba wax, amides, hydroxy fatty acids, dibenzylidene sorbitol, bis(p-methylbenzylidene)sorbitol, beeswax, stearamide, and hydroxystearic acid ethylenebisamide. If necessary, the thixotropic agent may further contain a fatty acid, such as caprylic acid, lauric acid, myristic acid, palmitic acid, stearic acid, or behenic acid, a hydroxy fatty acid, such as 1,2-hydroxystearic acid, an antioxidant, a surfactant, or an amine.

Examples of the activator include amine hydrohalides, organic halides, organic acids, organic amines, and polyhydric alcohols.

Examples of the amine hydrohalides include diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine hydrobromide, and monoethanolamine hydrobromide.

Examples of the organic halides include chlorinated paraffins, tetrabromoethane, dibromopropanol, 2,3-dibromo-1,4-butanediol, 2,3-dibromo-2-butene-1,4-diol, and tris(2,3-dibromopropyl)isocyanurate.

Examples of the organic acids include malonic acid, fumaric acid, glycolic acid, citric acid, malic acid, succinic acid, phenylsuccinic acid, maleic acid, salicylic acid, anthranilic acid, glutaric acid, suberic acid, adipic acid, sebacic acid, stearic acid, abietic acid, benzoic acid, trimellitic acid, pyromellitic acid, and dodecanoic acid.

Examples of the organic amines include monoethanolamine, diethanolamine, triethanolamine, tributylamine, aniline, and diethylaniline.

Examples of the polyhydric alcohols include erythritol, pyrogallol, and ribitol.

<Step of Forming Interlayer Connection Conductor>

Figure 11:
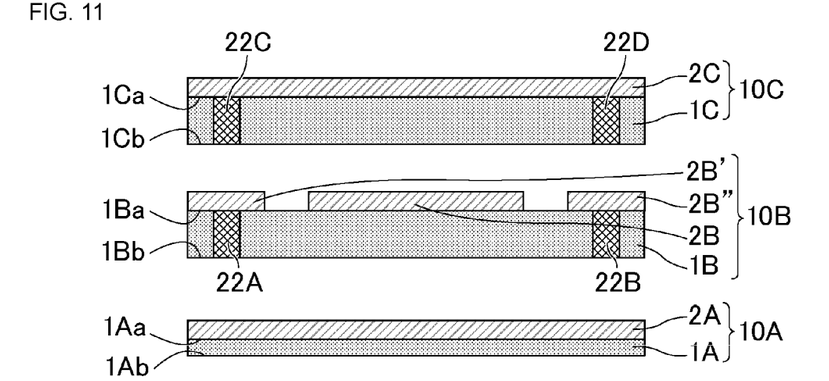
FIG. 11 is a schematic cross-sectional view of the step of forming an interlayer connection conductor in an example of a method for producing a multilayer substrate according to the present invention.

FIG. 11 is a schematic cross-sectional view of the step of forming an interlayer connection conductor in an example of a method for producing a multilayer substrate according to the present invention.

As illustrated in FIG. 11, the liquid crystal polymer film with the conductor layer 10A, the liquid crystal polymer film with the conductor layer 10B filled with the electrically conductive pastes 22A and 22B, and the liquid crystal polymer film with the conductor layer 10C filled with the electrically conductive pastes 22C and 22D are laminated in order in the lamination direction. The liquid crystal polymer films are laminated such that the surface (upper surface) of the conductor layer 2A of the liquid crystal polymer film with the conductor layer 10A is in contact with the surface (lower surface) of the liquid crystal polymer film 1B of the liquid crystal polymer film with the conductor layer 10B, and the surface (upper surface) of the conductor layer 2B (the conductor layers 2B' and 2B") of the liquid crystal polymer film with the conductor layer 10B is in contact with the surface (lower surface) of the liquid crystal polymer film 1C of the liquid crystal polymer film with the conductor layer 10C. In FIG. 11, for convenience of description, the liquid crystal polymer films with the conductor layer are separated from each other.

The multilayer body is heated and pressed in the lamination direction for hot pressing. Thus, the liquid crystal polymer film with the conductor layer 10A and the liquid crystal polymer film with the conductor layer 10B are pressure-bonded together, and the liquid crystal polymer film with the conductor layer 10B and the liquid crystal polymer film with the conductor layer 10C are pressure-bonded together. The electrically conductive pastes 22A, 22B, 22C, and 22D are solidified during hot pressing into the interlayer connection conductors 20A, 20B, 20C, and 20D, respectively. In this manner, the interlayer connection conductors 20A, 20B, 20C, and 20D are formed in the via-holes 21A, 21B, 21C, and 21D, respectively.

When the interlayer connection conductors 20A, 20B, 20C, and 20D are formed, the inner walls of the via-holes may be plated with a metal, such as copper, tin, or silver, instead of filling the via-holes with an electrically conductive paste.

Thus, the multilayer substrate 50 illustrated in FIG. 3 is produced.

A multilayer substrate according to the present invention preferably further includes a side surface conductor on a side surface extending in the lamination direction.

Figure 12:
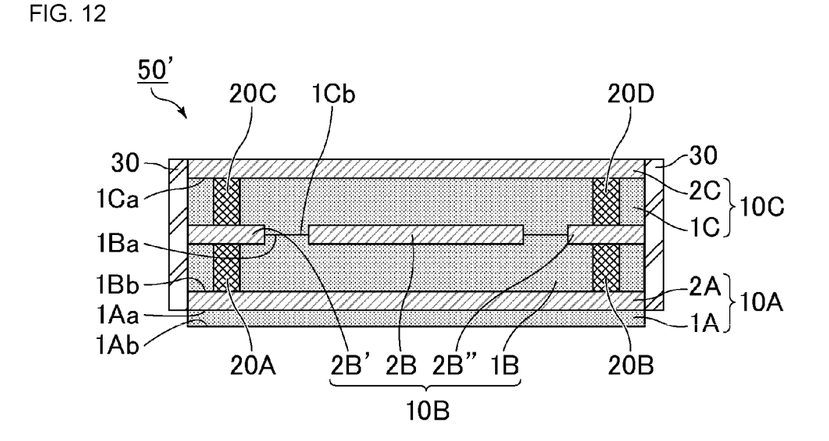
FIG. 12 is a schematic cross-sectional view of another example of a multilayer substrate according to the present invention.

FIG. 12 is a schematic cross-sectional view of another example of a multilayer substrate according to the present invention.

The multilayer substrate 50' illustrated in FIG. 12 further includes a side surface conductor 30 on the side surfaces in the lamination direction, in addition to the structure of the multilayer substrate 50 illustrated in FIG. 3.

The side surface conductors 30 can function as shield electrodes for shielding electromagnetic waves. The multilayer substrate 50' including the side surface conductors 30 easily has improved electromagnetic shielding properties on the side surfaces thereof.

In a multilayer substrate according to the present invention, the side surface conductors are preferably connected to the conductor layers.

In the multilayer substrate 50' illustrated in FIG. 12, the side surface conductors 30 are connected to the conductor layers 2A, 2B', 2B", and 2C. Thus, when the conductor layer 2A and the conductor layer 2C function as the ground electrodes as described above, the side surface conductors 30 function not only as the shield electrodes but also as the ground electrodes.

The side surface conductors 30 are composed of copper, tin, or silver, for example.

The side surface conductors 30 are formed, for example, by plating the side surfaces of a multilayer body of liquid crystal polymer films with a conductor layer with a metal, such as copper, tin, or silver, by sputtering or the like.

The multilayer substrate 50' includes the interlayer connection conductors 20A, 20B, 20C, and 20D in addition to the side surface conductors 30 but does not necessarily include these interlayer connection conductors.

EXAMPLES

The following examples more specifically disclose a liquid crystal polymer film according to the present invention and a liquid crystal polymer film with a conductor layer according to the present invention. However, the present invention is not limited to these examples.

First, the following liquid crystal polymers A, B, C, D, and E were prepared.

<Liquid Crystal Polymer A>

A type II wholly aromatic polyester, which was a copolymer of 75% by mole of 6-hydroxy-2-naphthoic acid and 25% by mole of p-hydroxybenzoic acid and had a melting point of 320° C. and a melt viscosity of 103 Pa·s, was prepared as the liquid crystal polymer A.

<Liquid Crystal Polymer B>

A type II wholly aromatic polyester, which was a copolymer of 75% by mole of 6-hydroxy-2-naphthoic acid and 25% by mole of p-hydroxybenzoic acid and had a melting point of 320° C. and a melt viscosity of 111 Pa·s, was prepared as the liquid crystal polymer B.

<Liquid Crystal Polymer C>

A type II wholly aromatic polyester, which was a copolymer of 75% by mole of 6-hydroxy-2-naphthoic acid and 25% by mole of p-hydroxybenzoic acid and had a melting point of 320° C. and a melt viscosity of 74 Pa·s, was prepared as the liquid crystal polymer C.

<Liquid Crystal Polymer D>

A type II wholly aromatic polyester, which was a copolymer of 20% by mole of 6-hydroxy-2-naphthoic acid and 80% by mole of p-hydroxybenzoic acid and had a melting point of 325° C. and a melt viscosity of 98 Pa·s, was prepared as the liquid crystal polymer D.

<Liquid Crystal Polymer E>

A type II wholly aromatic polyester, which was a copolymer of 75% by mole of 6-hydroxy-2-naphthoic acid and 25% by mole of p-hydroxybenzoic acid and had a melting point of 320° C. and a melt viscosity of 79 Pa·s, was prepared as the liquid crystal polymer E.

The melt viscosities of the liquid crystal polymers A, B, C, D, and E were measured at a temperature of 330° C. and a shear rate of 1000 s$^{-1}$.

Liquid crystal polymer films according to Examples 1 to 8 and Comparative Examples 1 to 6 were produced from a resin material containing liquid crystal polymers at a blending ratio shown in Table 1 by a known film forming method described above. In the production of the liquid crystal polymer film according to Comparative Example 6, the liquid crystal polymer film according to Comparative Example 5 was further heat-treated at approximately the melting point of the liquid crystal polymer constituting the resin material thereof to adjust the coefficient of linear expansion.

Furthermore, a copper foil "WS" (the coefficient of linear expansion in the in-plane direction: 16.5 ppm/K) manufactured by Furukawa Electric Co., Ltd. was pressure-bonded to the liquid crystal polymer films according to Examples 1 to 8 and Comparative Examples 1 to 6 to produce liquid crystal polymer films with a conductor layer according to Examples 1 to 8 and Comparative Examples 1 to 6.

"A", "B", "C", "D", and "E" in Table 1 denote the liquid crystal polymers A, B, C, D, and E, respectively.

[Evaluation]

The liquid crystal polymer films according to Examples 1 to 8 and Comparative Examples 1 to 6 were examined as described below. Table 1 shows the results.

<$^{13}$C-NMR Spectrum>

First, 5 g of the liquid crystal polymer film and 200 cc of methanol were put into a high-temperature and high-pressure reactor "MMJ-500" manufactured by OM Labotech. The high-temperature and high-pressure reactor was purged with argon and was then heated to 280° C. for 15 minutes to prepare a solution of the liquid crystal polymer film. Heating the system vaporized methanol, pressurized the system to the critical pressure of methanol, and brought the methanol in the system to a supercritical state. The solution was then dried under vacuum to remove the solvent and prepare a powder of a decomposition product of the liquid crystal polymer film decomposed with the supercritical methanol. Then, 0.014 g of the powder of the decomposition product of the liquid crystal polymer film was dissolved in 0.7 ml of deuterated methanol to prepare an NMR measurement sample.

A $^{13}$C-NMR spectrum of the NMR measurement sample was then measured with a Fourier transform nuclear magnetic resonance measuring apparatus "JNM-ECP600" manufactured by JEOL Ltd. An integral value CA of a peak derived from a benzene ring, an integral value CB of a peak derived from a naphthalene ring, and an integral value CC of a peak derived from a carboxymethyl group were then determined from the $^{13}$C-NMR spectrum.

A peak derived from a benzene ring, more specifically, a peak derived from methyl p-hydroxybenzoate was considered to be a peak with a chemical shift of 113 ppm to 115 ppm (114±1 ppm). A peak derived from a naphthalene ring, more specifically, a peak of methyl 6-hydroxy-2-naphthoate was considered to be a peak with a chemical shift of 107 ppm to 109 ppm (108±1 ppm). A peak derived from a carboxymethyl group, more specifically, a peak of a methyl group derived from an ester was considered to be a peak with a chemical shift of 49 ppm to 51 ppm (50±1 ppm).

In Table 1, CA, CB, and CC are converted values based on the integral value of the peak derived from deuterated methanol in the range of 47 ppm to 48 ppm (47.5±0.5 ppm), which was taken as 100.

(CA+CB)/CC was calculated from CA, CB, and CC thus determined.

<Coefficient of Linear Expansion>

The coefficient of linear expansion in the machine direction (first direction) and the coefficient of linear expansion in the transverse direction (second direction) of a liquid crystal polymer film were measured in accordance with JIS C 6481-1996.

More specifically, a liquid crystal polymer film sample with a width of 4 mm was cooled from 170° C. to 30° C. at a cooling rate of 10° C./min under a load of 0.1 N in the machine direction (first direction) using a thermomechanical analyzer "Q400" manufactured by TA Instruments at an initial grip distance of 16 mm. During the temperature decrease, the change in grip distance was measured in the temperature range of 100° C. to 50° C. to determine the coefficient of linear expansion of the liquid crystal polymer film in the machine direction (first direction).

The coefficient of linear expansion of the liquid crystal polymer film in the transverse direction (second direction) was also determined in the same manner as the coefficient of linear expansion in the machine direction (first direction) except that the load was applied in the transverse direction (second direction).

The coefficient of linear expansion of the liquid crystal polymer film in the thickness direction was measured. More specifically, a 7 mm×7 mm strip of a liquid crystal polymer film sample was heated from 30° C. to 200° C. at a heating rate of 2° C./min in a first heating step and from 30° C. to 120° C. in a second heating step using a two-beam Michelson laser interferometry dilatometer "LIX-2L" manufactured by ADVANCE RIKO, Inc. In the second heating step, the amount of displacement of the liquid crystal polymer film sample was measured in the temperature range of 50° C. to 100° C. to determine the coefficient of linear expansion in the thickness direction.

In Table 1, "CTE-MD", "CTE-TD", and "CTE-HD" denote the coefficient of linear expansion in the machine direction (first direction), the coefficient of linear expansion in the transverse direction (second direction), and the coefficient of linear expansion in the thickness direction of the liquid crystal polymer film, respectively. Table 1 also shows, as "Difference from copper foil", the difference of the coefficient of linear expansion in the machine direction (first direction) and the coefficient of linear expansion in the transverse direction (second direction) of the liquid crystal polymer film from the coefficient of linear expansion in the in-plane direction (16.5 ppm/K) of copper foil pressure-bonded in the production of the liquid crystal polymer film with the conductor layer.

Table 1 also shows, as "CTE-Total", the total of the coefficient of linear expansion in the machine direction (first direction), the coefficient of linear expansion in the transverse direction (second direction), and the coefficient of linear expansion in the thickness direction of the liquid crystal polymer film.

<Storage Elastic Modulus>

The temperature dependence of the storage elastic modulus of a liquid crystal polymer film was measured with a dynamic viscoelastometer "RSA-G2" manufactured by TA Instruments at a dynamic strain of 0.25%, a frequency of 0.5 Hz, and a heating rate of 10° C./min in the temperature range of 40° C. to 320° C. Table 1 shows the storage elastic modulus of the liquid crystal polymer film at 250° C. as G'-250° C.

The liquid crystal polymer films with the conductor layer according to Examples 1 to 8 and Comparative Examples 1 to 6 were further examined as described below. Table 1 shows the results.

<Warping Height>

A sample with a square planar shape 250 mm in the machine direction (first direction) and 250 mm in the transverse direction (second direction) was cut out from a liquid crystal polymer film with a conductor layer. The cut-out sample was placed on the surface of a glass plate with the convex side down (with the edges floating). The heights of the four corners of the sample from the surface of the glass plate were measured with a scale. An average value calculated from the measured heights of the four corners of the sample was taken as a warping height. In Table 1, the sign of the warping height was "+" when the copper foil of the sample placed on the surface of the glass plate faced the glass plate and was convex downward and was "−" when the liquid crystal polymer film faced the glass plate and was convex downward.

<Transferability>

After the warping height was measured as described above, transferability of a sample using a suction mechanism, such as a suction pad or a suction plate, was evaluated. In Table 1, a sample transferred without any trouble, such as suction failure in the suction mechanism, was rated good "O", and a sample not transferred due to a trouble, such as dropping of the sample during transfer due to suction failure in the suction mechanism, was rated poor "x".

TABLE 1

| | Blending ratio of liquid crystal polymers (% by weight) | | | | | $^{13}$C-NMR spectrum | | | |
|---|---|---|---|---|---|---|---|---|---|
| | A | B | C | D | E | CA | CB | CC | (CA + CB)/CC |
| Example 1 | 90 | 0 | 0 | 10 | 0 | 1.32 | 1.67 | 2.01 | 1.49 |
| Example 2 | 80 | 0 | 0 | 20 | 0 | 1.39 | 1.52 | 1.83 | 1.59 |
| Example 3 | 0 | 90 | 0 | 10 | 0 | 1.46 | 1.63 | 2.26 | 1.37 |
| Example 4 | 0 | 80 | 0 | 20 | 0 | 1.78 | 1.64 | 2.46 | 1.39 |
| Example 5 | 0 | 85 | 0 | 15 | 0 | 1.32 | 1.43 | 1.98 | 1.39 |
| Example 6 | 0 | 0 | 85 | 15 | 0 | 1.07 | 1.39 | 1.82 | 1.35 |
| Example 7 | 0 | 0 | 80 | 20 | 0 | 1.22 | 1.23 | 1.69 | 1.45 |
| Example 8 | 0 | 0 | 0 | 25 | 75 | 1.35 | 1.28 | 1.63 | 1.62 |
| Comparative example 1 | 100 | 0 | 0 | 0 | 0 | 0.93 | 1.56 | 2.17 | 1.15 |
| Comparative example 2 | 0 | 100 | 0 | 0 | 0 | 0.95 | 2.06 | 2.33 | 1.29 |
| Comparative example 3 | 0 | 0 | 100 | 0 | 0 | 0.66 | 1.50 | 1.73 | 1.25 |
| Comparative example 4 | 0 | 0 | 0 | 0 | 100 | 0.47 | 0.84 | 1.15 | 1.14 |
| Comparative example 5 | 0 | 0 | 0 | 100 | 0 | 4.81 | 0.69 | 2.96 | 1.86 |
| Comparative example 6 | 0 | 0 | 0 | 100 | 0 | 4.70 | 0.67 | 2.89 | 1.86 |

| | Coefficient of linear expansion (ppm/K) | | | | | | Storage elastic modulus (MPa) G'-250° C. | Warping height (mm) | Transferability |
|---|---|---|---|---|---|---|---|---|---|
| | CTE-MD | | CTE-TD | | | | | | |
| | | Difference from copper foil | | Difference from copper foil | CTE-HD | CTE-Total | | | |
| Example 1 | 18 | +1.5 | 13 | −3.5 | 195 | 226 | 439 | +4.5 | o |
| Example 2 | 15 | −1.5 | 13 | −3.5 | 204 | 232 | 349 | +4.7 | o |
| Example 3 | 17 | +0.5 | 18 | +1.5 | 196 | 231 | 470 | −2.0 | o |
| Example 4 | 14 | −2.5 | 13 | −3.5 | 205 | 232 | 390 | +3.0 | o |
| Example 5 | 17 | +0.5 | 14 | −2.5 | 202 | 233 | 413 | +2.7 | o |
| Example 6 | 18 | +1.5 | 14 | −2.5 | 201 | 233 | 267 | +3.3 | o |
| Example 7 | 17 | +0.5 | 15 | −1.5 | 202 | 234 | 226 | +2.0 | o |
| Example 8 | 18 | +1.5 | 15 | −1.5 | 201 | 234 | 256 | −3.0 | o |
| Comparative example 1 | 19 | +2.5 | 15 | −1.5 | 193 | 227 | 545 | −0.5 | o |
| Comparative example 2 | 19 | +2.5 | 19 | +2.5 | 194 | 232 | 609 | −2.8 | o |
| Comparative example 3 | 20 | +3.5 | 17 | +0.5 | 195 | 232 | 512 | −3.0 | o |
| Comparative example 4 | 17 | +0.5 | 18 | +1.5 | 199 | 234 | 509 | −2.0 | o |
| Comparative example 5 | 20 | +3.5 | 18 | +1.5 | 221 | 259 | 254 | −3.1 | o |
| Comparative example 6 | 30 | +13.5 | 28 | +11.5 | 201 | 259 | 254 | −17.0 | x |

As shown in Table 1, the liquid crystal polymer films according to Examples 1 to 8 with (CA+CB)/CC of 1.35 to 1.65 had a coefficient of linear expansion in the thickness direction as low as 210 ppm/K or less and a storage elastic modulus as low as 500 MPa or less at 250° C.

As described above, the liquid crystal polymer films according to Examples 1 to 8 had a low coefficient of linear expansion in the thickness direction. Thus, in multilayer substrates with an interlayer connection conductor produced from these liquid crystal polymer films, it is thought that the interlayer connection conductor is less likely to have a crack and is consequently less likely to have lower connection reliability.

Furthermore, the liquid crystal polymer films according to Examples 1 to 8 had a low storage elastic modulus. Thus, it is thought that the multilayer substrates with an interlayer connection conductor produced from these liquid crystal polymer films tend to have the effects of the liquid crystal polymer, such as improved dielectric properties in a high-frequency region and smaller changes in dielectric properties due to moisture absorption.

The reason why the storage elastic modulus at 250° C. is taken as the storage elastic modulus of the liquid crystal polymer film as described above is that the reflow temperature is often approximately 250° C. when a multilayer substrate produced by using the liquid crystal polymer film is incorporated into an electronic device by reflow soldering. It is thought that, due to a low storage elastic modulus at 250° C., the liquid crystal polymer films according to Examples 1 to 8 are not difficult to deform at the time of reflow and easily improve the mountability of the multilayer substrates.

Furthermore, the liquid crystal polymer films according to Examples 1 to 8 had a coefficient of linear expansion in the machine direction (first direction) and a coefficient of linear expansion in the transverse direction (second direction) as low as 13 ppm/K to 20 ppm/K, and the difference from these coefficients of linear expansion from the coefficient of linear expansion in the in-plane direction (16.5 ppm/K) of the copper foil was within the range of ±10 ppm/K.

On the other hand, the liquid crystal polymer films according to Comparative Examples 1 to 4 with (CA+CB)/CC of less than 1.35 had a storage elastic modulus of more than 500 MPa at 250° C.

The liquid crystal polymer film according to Comparative Example 5 with (CA+CB)/CC of more than 1.65 had a coefficient of linear expansion of more than 210 ppm/K in the thickness direction.

The liquid crystal polymer film according to Comparative Example 6 had the same resin material and the same (CA+CB)/CC as the liquid crystal polymer film according to Comparative Example 5, but the coefficient of linear expansion in the machine direction (first direction) and the coefficient of linear expansion in the transverse direction (second direction) were greatly adjusted, so that the coefficient of linear expansion in the thickness direction was slightly adjusted to 210 ppm/K or less. In the liquid crystal polymer film of Comparative Example 6, however, the greatly adjusted coefficients of linear expansion in the machine direction (first direction) and in the transverse direction (second direction) resulted in a large difference from the coefficient of linear expansion in the in-plane direction (16.5 ppm/K) of the copper foil. Thus, the liquid crystal polymer film with the conductor layer according to Comparative Example 6 produced by using the liquid crystal polymer film according to Comparative Example 6 had an increased warping height and lower transferability.

REFERENCE SIGNS LIST 1, 1A, 1B, 1C liquid crystal polymer film
1a, 1Aa, 1Ba, 1Ca first main surface of liquid crystal polymer film
1b, 1Ab, 1Bb, 1Cb second main surface of liquid crystal polymer film
2, 2A, 2B, 2B', 2B", 2C conductor layer
10, 10A, 10B, 10C liquid crystal polymer film with a conductor layer
20A, 20B, 20C, 20D interlayer connection conductor
21A, 21B, 21C, 21D via-hole
22A, 22B, 22C, 22D electrically conductive paste
30 side surface conductor
50, 50' multilayer substrate
HD thickness direction
MD machine direction (first direction)
TD transverse direction (second direction)

The invention claimed is:

1. A liquid crystal polymer film, comprising:
a benzene ring;
a naphthalene ring; and
a carboxymethyl group,
wherein, in a $^{13}$C-NMR spectrum of the liquid crystal polymer film decomposed with supercritical methanol, an integral value CA of a peak derived from the benzene ring, an integral value CB of a peak derived from the naphthalene ring, and an integral value CC of a peak derived from the carboxymethyl group satisfy (CA+CB)/CC of 1.35 to 1.65.

2. The liquid crystal polymer film according to claim 1, wherein (CA+CB)/CC is 1.35 to 1.60.

3. The liquid crystal polymer film according to claim 1, wherein, in the $^{13}$C-NMR spectrum of a NMR measurement sample prepared by dissolving a powder of a decomposition product of the liquid crystal polymer film decomposed with the supercritical methanol in deuterated methanol at a ratio of 0.02 g per milliliter of the deuterated methanol, when an integral value of a peak derived from the deuterated methanol is 100, the integral value CA of the peak derived from the benzene ring is 1.05 to 1.80.

4. The liquid crystal polymer film according to claim 1, wherein, in the $^{13}$C-NMR spectrum of a NMR measurement sample prepared by dissolving a powder of a decomposition product of the liquid crystal polymer film decomposed with supercritical methanol in deuterated methanol at a ratio of 0.02 g per milliliter of the deuterated methanol, when an integral value of a peak derived from the deuterated methanol is 100, the integral value CB of the peak derived from the naphthalene ring is 1.20 to 1.70.

5. The liquid crystal polymer film according to claim 1, wherein, in the $^{13}$C-NMR spectrum of a NMR measurement sample prepared by dissolving a powder of a decomposition product of the liquid crystal polymer film decomposed with supercritical methanol in deuterated methanol at a ratio of 0.02 g per milliliter of the deuterated methanol, when an integral value of a peak derived from the deuterated methanol is 100, the integral value CC of the peak derived from the carboxymethyl group is 1.60 to 2.50.

6. The liquid crystal polymer film according to claim 1, wherein, in the $^{13}$C-NMR spectrum of a NMR measurement sample prepared by dissolving a powder of a decomposition product of the liquid crystal polymer film decomposed with the supercritical methanol in deuterated methanol at a ratio of 0.02 g per milliliter of the deuterated methanol, when an integral value of a peak derived from the deuterated methanol is 100, the integral value CA of the peak derived from the benzene ring is 1.05 to 1.80, the integral value CB of the peak derived from the naphthalene ring is 1.20 to 1.70, and the integral value CC of the peak derived from the carboxymethyl group is 1.60 to 2.50.

7. The liquid crystal polymer film according to claim 1, wherein the liquid crystal polymer has a coefficient of linear expansion in a thickness direction higher than a coefficient of linear expansion in a first direction perpendicular to the thickness direction and higher than a coefficient of linear expansion in a second direction perpendicular to the thickness direction and to the first direction.

8. The liquid crystal polymer film according to any one of claim 7, the coefficient of linear expansion is 16.5±10 ppm/K in the first direction and in the second direction.

9. A laminate structure comprising:
the liquid crystal polymer film according to claim 1; and
a conductor layer adjacent to at least one main surface of the liquid crystal polymer film.

10. The laminate structure according to claim 9, wherein the conductor layer is a copper foil.

11. The laminate structure according to claim 10, wherein the liquid crystal polymer film has a coefficient of linear expansion of 13 ppm/K to 20 ppm/K in a first direction perpendicular to a lamination direction of the liquid crystal polymer and the conductor layer.

12. The laminate structure according to claim 11, wherein the liquid crystal polymer film has a coefficient of linear expansion of 13 ppm/K to 20 ppm/K in a second direction perpendicular to the lamination direction and to the first direction.

13. A multilayer substrate comprising the laminate structure according to claim 9.

14. The multilayer substrate according to claim 13, further comprising an interlayer connection conductor extending through the liquid crystal polymer film in the lamination direction and connected to the conductor layer without extending through the conductor layer in a lamination direction of the liquid crystal polymer and the conductor layer.

15. The multilayer substrate according to claim 13, further comprising a side surface conductor on a side surface of the multilayer substrate and extending in a lamination direction of the liquid crystal polymer and the conductor layer.

16. The multilayer substrate according to claim 15, wherein the side surface conductor is electrically connected to the conductor layer.

* * * * *